US006919913B1

(12) United States Patent
Inada et al.

(10) Patent No.: US 6,919,913 B1
(45) Date of Patent: Jul. 19, 2005

(54) PROCESSING SYSTEM

(75) Inventors: Hiroichi Inada, Kumamoto (JP); Issei Ueda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/550,592

(22) Filed: Apr. 17, 2000

(30) Foreign Application Priority Data

Apr. 19, 1999 (JP) ............................................ 11-111452

(51) Int. Cl.⁷ .............................................. H04N 7/18
(52) U.S. Cl. ............................. 348/61; 348/86; 348/87
(58) Field of Search ............................. 348/61, 86, 87; 382/106, 151; 396/204; 224/758; 430/321; 216/41; 117/85; 118/319; 438/406; 29/407.04

(56) References Cited

U.S. PATENT DOCUMENTS

| | | | | |
|---|---|---|---|---|
| 4,786,867 A | * | 11/1988 | Yamatsu | 324/758 |
| 5,577,130 A | * | 11/1996 | Wu | 382/106 |
| 5,620,560 A | * | 4/1997 | Akimoto et al. | 216/41 |
| 5,623,473 A | * | 4/1997 | Ichihara | 430/321 |
| 5,815,594 A | * | 9/1998 | Tanaka | 382/151 |
| 5,953,620 A | * | 9/1999 | Katou et al. | 438/406 |
| 5,993,552 A | * | 11/1999 | Tsukamoto et al. | 118/319 |
| 6,126,744 A | * | 10/2000 | Hawkins et al. | 117/85 |
| 6,314,631 B1 | * | 11/2001 | Pryor | 29/407.04 |

FOREIGN PATENT DOCUMENTS

| | | |
|---|---|---|
| JP | 5-152417 | 6/1993 |
| JP | 5-343495 | 12/1993 |
| JP | 6-29224 | 2/1994 |
| JP | 9-306849 | 11/1997 |
| JP | 9-329423 | 12/1997 |
| JP | 11-5056 | 1/1999 |
| JP | 11-016810 | 1/1999 |
| JP | 11-329912 | 11/1999 |

* cited by examiner

Primary Examiner—Allen Wong
(74) Attorney, Agent, or Firm—Rader, Fishman & Grauer PLLC

(57) ABSTRACT

A CCD camera and a laser displacement measurement apparatus are provided on a transfer apparatus for transferring a wafer between processing units. The transfer apparatus performs a predetermined image pickup in each processing unit with the CCD camera and the laser displacement measurement apparatus 62 to perform monitoring of a required place in the processing unit. According to the above configuration, it is possible to monitor the required place in the processing unit without an increase in number of components and further without consideration of a space for provision of an image pickup means.

7 Claims, 12 Drawing Sheets

PROCESSING SYSTEM

BACKGROUND OF THE INVENTION

1. Field of the Invention

The present invention is included in a technical field of, for example, semiconductor device fabrication, and more specifically, relates to a processing system including an image pickup means for monitoring units on a transfer apparatus for transferring a substrate.

2. Description of the Related Art

In a photoresist processing step in semiconductor device fabrication, for example, a resist solution is supplied to a substrate such as a semiconductor wafer (hereinafter, referred to as "a wafer") or the like to form a resist film, a predetermined pattern is exposed, and thereafter a developing solution is supplied to the wafer to perform developing processing. When such a series of processing is performed, a coating and developing processing system is used conventionally.

The coating and developing processing system comprises processing units for separately performing a series of processing necessary for coating and developing processing for a wafer, for example, hydrophobic processing (adhesion processing) for enhancing fixedness of a resist, resist coating processing for performing coating of a resist solution, heating processing for heating the wafer after the coating of the resist solution to cure a resist film, heating processing for heating the wafer after exposure at a predetermined temperature, developing processing for performing developing processing for the wafer after exposure, and the like.

These units have points to be monitored respectively, and thus the number of points to be monitored is considerably large in the whole coating and developing processing system including many units. For instance, in a spin-coat type of resist coating unit and developing unit, it is necessary to monitor whether a processing solution such as a resist solution, a developing solution, or the like is supplied onto the center of a rotated substrate. At that time, from the viewpoint of resist solution saving and uniform coating, it is necessary to monitor the state of the processing solution which extends by centrifugal force, especially the condition of the edge of the extending solution spreading out. Moreover, it is also necessary to monitor a liquid drip which occurs at the tip of a nozzle for supplying the processing solution. In a heating processing unit and a cooling processing unit, it is necessary to monitor whether the wafer is placed at a predetermined position on a hot plate or a cooling plate.

Therefore, it is considered, for instance, that an image pickup means such as a CCD camera is provided at each position which needs to be monitored in each processing unit, and that the above monitoring is performed based on the image pickup result. However, there is a problem that the number of positions to be monitored is large, and thus the number of components such as a CCD camera and the like is quite large. Moreover, there is another problem that since it is strongly demanded to miniaturize and thin each processing unit, a space for provision of the image pickup means such as a CCD camera or the like can not be secured.

SUMMARY OF THE INVENTION

An object of the present invention is to provide a processing system capable of performing monitoring of a required place in a processing unit without an increase in number of components and additionally without consideration of a space for provision of an image pickup means.

To attain the above object, a processing system in the main aspect of the present invention comprises a plurality of processing units for performing predetermined processing for a substrate, a transfer apparatus for transferring the substrate at least between the processing units, and an image pickup means, provided on the transfer apparatus, for picking-up an image of the inside of the processing units.

According to the present invention, the image pickup means for picking-up an image of the inside of each unit is provided on the transfer apparatus for getting access to the processing unit, so that it becomes unnecessary to provide an image pickup means for monitoring each required point in each processing unit. Accordingly, monitoring of the required place in the processing unit can be performed without an increase in number of components and additionally without consideration of a space for provision of an image pickup means.

These objects and still other objects and advantages of the present invention will become apparent upon reading the following specification when taken in conjunction with the accompanying drawings.

DETAILED DESCRIPTION OF THE PREFERRED EMBODIMENT

Figure 1:
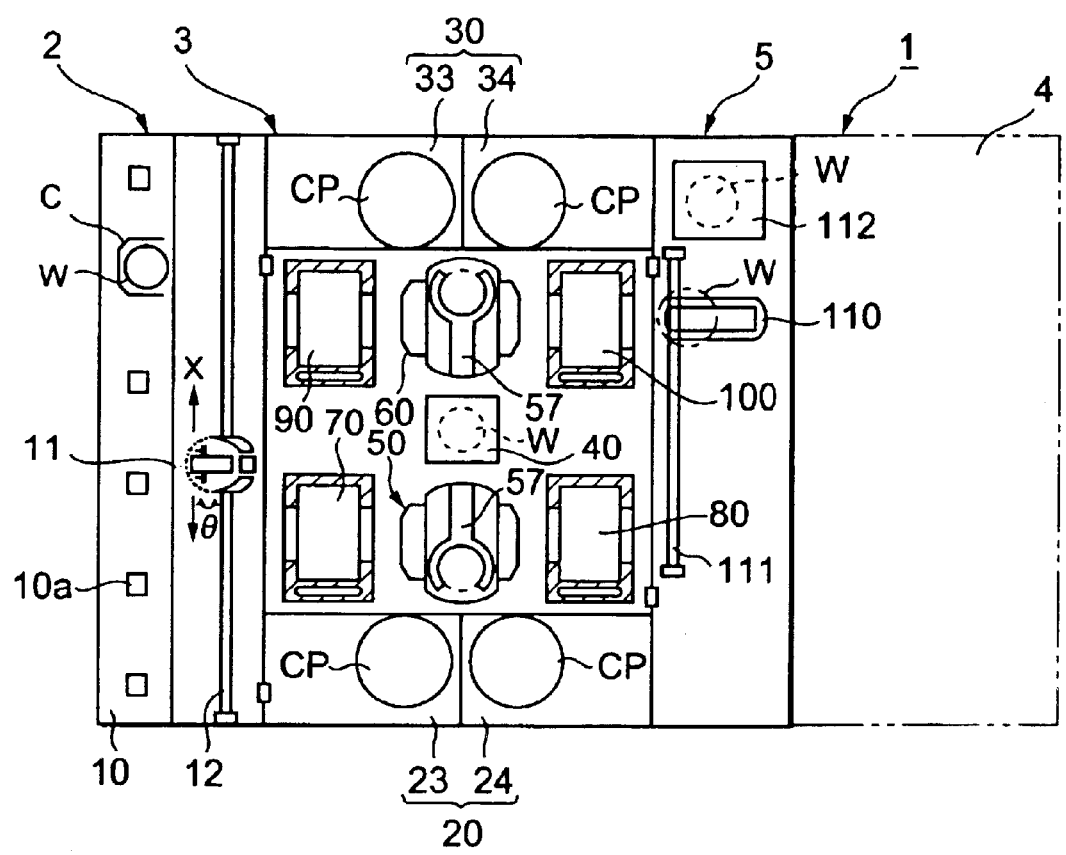
FIG. 1 is a plane view showing the structure of a coating and developing processing system in an embodiment of the present invention.
Figure 2:
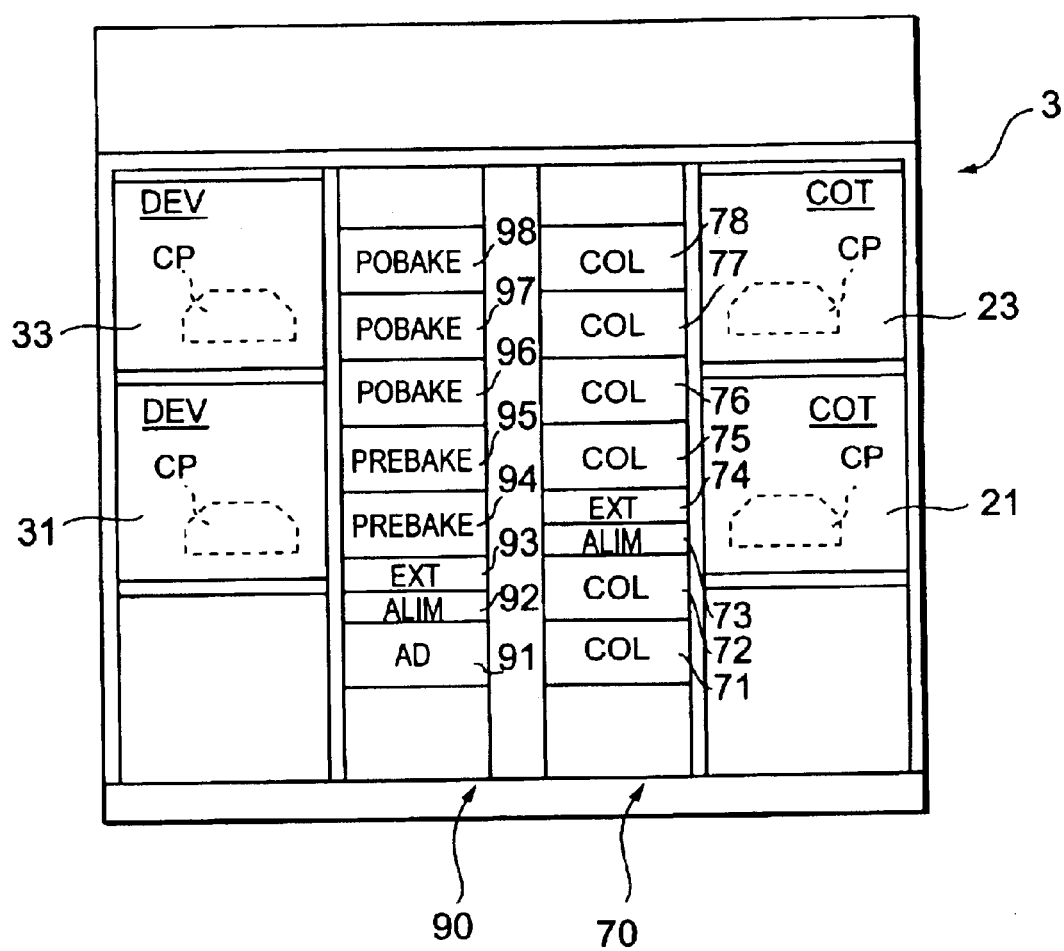
FIG. 2 is a left side view of the coating and developing processing system shown in FIG. 1.
Figure 3:
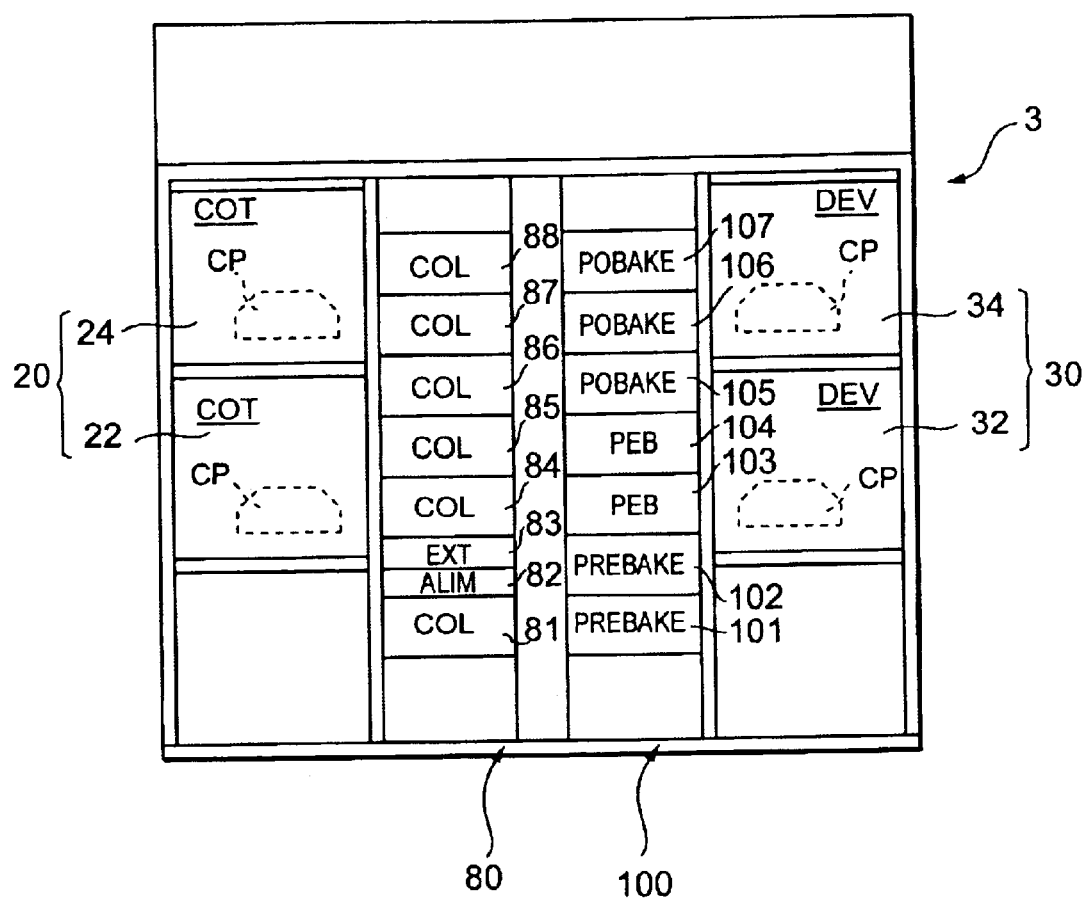
FIG. 3 is a right side view of the coating and developing processing system shown in FIG. 1.

Hereinafter, an embodiment of the present invention will be described with reference to the accompanying drawings. FIG. 1 to FIG. 3 show the appearance of a coating and developing processing system according to the embodiment, and FIG. 1 shows the appearance seen from a plane and FIG. 2 and FIG. 3 show that from sides respectively.

The coating and developing processing system 1 has a configuration in which a cassette station 2 for carrying, for example, 25 wafers W per cassette from/to the outside to/from the coating and developing processing system 1, and for carrying the wafers W into/out of a cassette C, a processing station 3 in which various processing units are multi-tiered and each processing unit gives predetermined processing to the wafers W one by one in coating and developing processing steps, and an interface section 5 for delivering the wafer W to/from an aligner 4 which is disposed adjacent to the processing station 3 are integrally connected.

In the cassette station 2, a plurality of cassettes C are mountable in a line in an X-direction (in a vertical direction in FIG. 1), with the respective ports for the wafer W facing the side of the processing station 3 at positions of positioning projections 10a on a cassette mounting table 10. A wafer transfer body 11 movable in the direction of arrangement of the cassettes C (the X-direction) and in the direction of arrangement of the wafers W housed in the cassettes C (a Z-direction; a vertical direction), can freely move along a transfer path 12 and selectively get access to each cassette C.

The wafer transfer body 11 is also structured to be rotatable in a θ-direction so as to be accessible to an extension unit 74 included in a multi-tiered unit section of a first cooling processing unit group 70 and an alignment unit 92 included in a first heating processing unit group 90 which will be explained later.

In the processing station 3, a resist coating unit group 20 is disposed at the front side thereof and a developing processing unit group 30 is disposed at the rear side respectively. There is no harm in disposing the developing processing unit group 30 at the front side and the resist coating unit group 20 at the rear side respectively.

As shown in FIG. 2 and FIG. 3, the resist coating unit group 20 is structured by resist coating units 21 and 22 for performing resist coating processing for a wafer W by placing the wafer W on a spin chuck and applying a resist solution thereto in a cup CP being disposed in a row and further resist coating units 23 and 24 being stacked on stages above the resist coating units 21 and 22 respectively.

The developing processing unit group 30 is structured by developing processing units 31 and 32 for performing developing processing for the wafer W by placing the wafer W on a spin chuck and supplying a developing solution thereto in a cup CP being disposed in a row and further developing processing units 33 and 34 being stacked on stages above the developing processing units 31 and 32 respectively.

A delivery table 40 on which a wafer W can be freely mounted is provided at the center of the processing station 3.

The resist coating unit group 20 and the developing processing unit group 30 face each other with the delivery table 40 therebetween, and a first transfer apparatus 50 is provided between the resist coating unit group 20 and the delivery table 40 and a second transfer apparatus 60 is provided between the developing processing unit group 30 and the delivery table 40 respectively.

Figure 4:
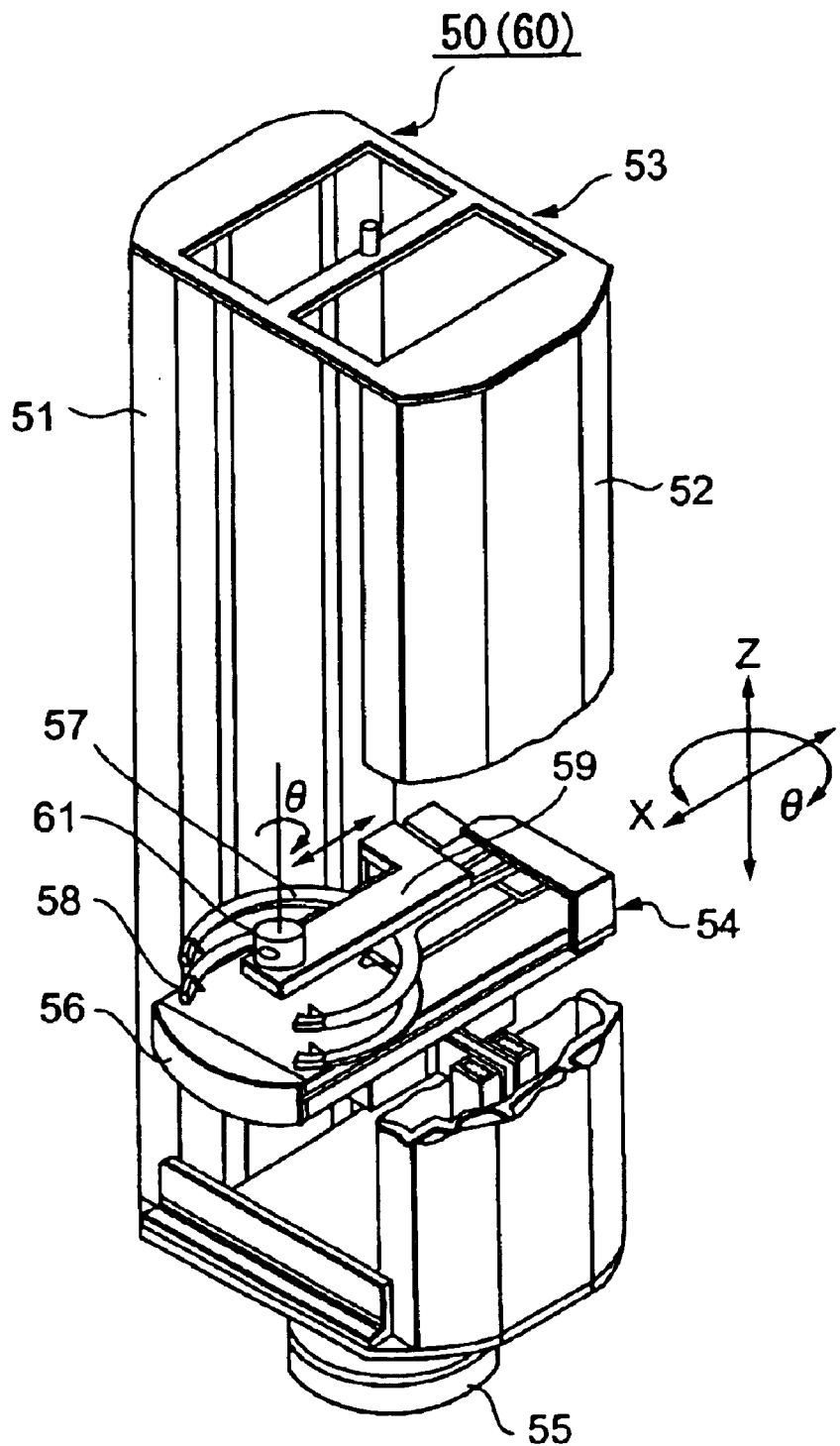
FIG. 4 is a perspective view of a transfer apparatus shown in FIG.1.

The first transfer apparatus 50 and the second transfer apparatus 60 have basically the same structure, and thus the structure of the first transfer apparatus 50 is explained with reference to FIG. 4. The first transfer apparatus 50 includes a wafer transfer means 54 ascendable and descendable in the vertical direction (the Z-direction) within a cylindrical support body 53 having wall portions 51 and 52 in one piece which are jointed with each other at top ends and bottom ends thereof and face each other. The cylindrical support body 53 is connected to the rotation shaft of a motor 55 and rotated around the rotation shaft integrally with the wafer transfer means 54 by a rotational drive force of the motor 55. Accordingly, the wafer transfer means 54 is rotatable in the θ-direction.

Figure 5:
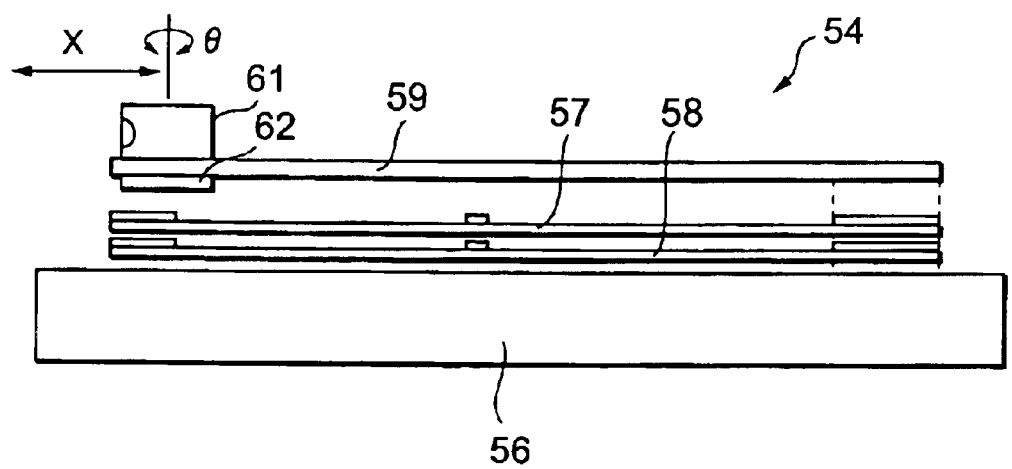
FIG. 5 is a side view of a wafer transfer means in the transfer apparatus shown in FIG. 4.

On a transfer base 56 of the wafer transfer means 54, two tweezers 57 and 58 each for holding the wafer w are vertically provided as shown in FIG. 5. The tweezers 57 and 58 have basically the same structure and each has the shape and the size capable of passing through side openings between both the wall portions 51 and 52 of the cylindrical support body 53. Each of the tweezers 57 and 58 is movable forward and rearward by means of the motor (not shown) embedded in the transfer base 56. Moreover, a CCD camera support member 59 is provided above the tweezers 57 and 58. The CCD camera support member 59 can be moved forward and rearward by the motor (not shown) which is embedded in the transfer base 56, and additionally the tip thereof can be tilted downward. Furthermore, a CCD camera 61 for picking-up an image in the horizontal direction is provided on the top of the tip of the CCD camera support member 59 and a laser displacement measurement apparatus 62 for detecting a height displacement in a downward direction is mounted on the bottom of the tip thereof (not mounted on the second transfer apparatus 60). The CCD camera 61 is rotatable in the θ-direction by the motor (not shown) embedded in the CCD camera support member 59. In the laser displacement measurement apparatus 62, many sensing elements are arranged in a Y-direction. The CCD camera 61 and the laser displacement measurement apparatus 62 may be integrated with the tweezers 57 and 58 instead of being provided on an exclusive support member.

Figure 6:
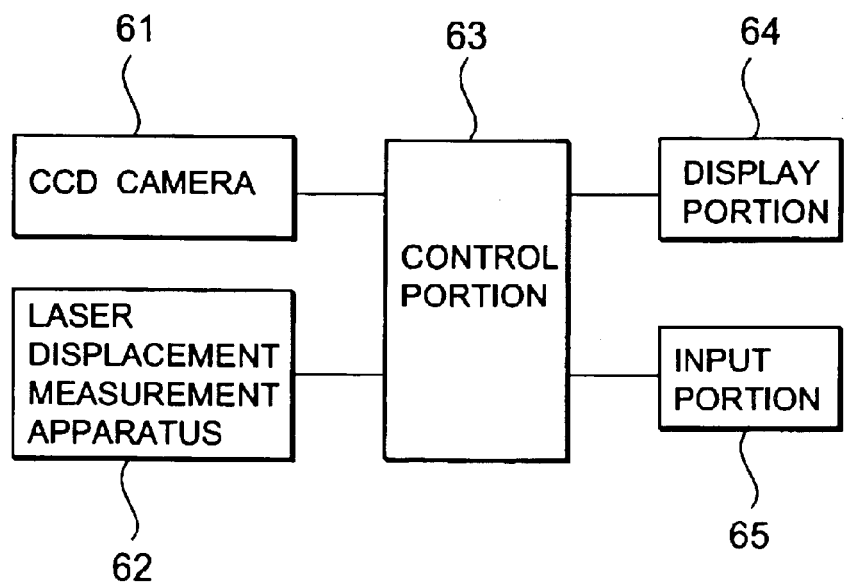
FIG. 6 is a block diagram showing a control system in the coating and developing processing system shown in FIG. 1.

As shown in FIG. 6, the results of image picked-up by the CCD camera 61 and the laser displacement measurement apparatus 62 are sent to a control portion 63. The control portion 63 is connected with a display portion 64 and an input portion 65 such as a key board or the like. The control portion 63 controls operations of the CCD camera 61 and the like to perform a predetermined monitoring based on the image pickup results, and the monitored results are displayed on the display portion 64. There is no harm in reporting the monitored results by the medium of sound or to report it to the host side by a LAN connection to be controlled centrally. For such monitoring, used is an automatic mode in which an image of a predetermined position in the processing unit is picked-up in predetermined procedures with the CCD camera 61, and additionally, a manual mode in which an image of a desired position in the processing unit is picked-up by means of the CCD camera 61 through manual running operations with the input portion 65.

Figure 7:
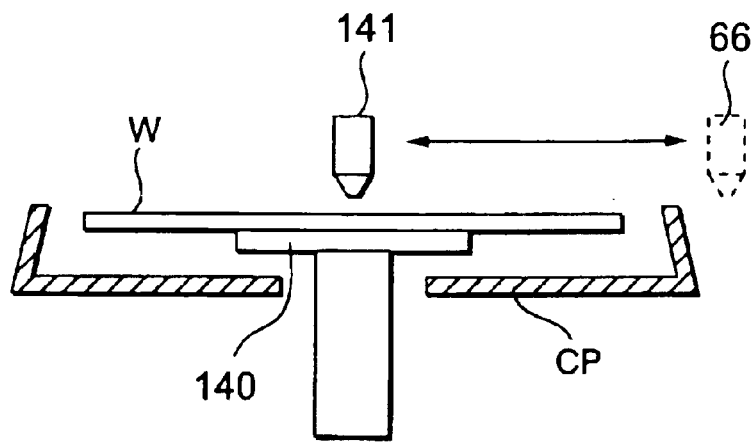
FIG. 7 is a view showing a schematic structure of a resist coating unit in the coating and developing processing system shown in FIG. 1.

FIG. 7 is a view showing a schematic structure of the aforesaid resist coating units 21 to 24.

As shown in FIG. 7, a cup CP is disposed nearly at the center of each unit, and a spin chuck 140 for rotatably holding a wafer W is disposed in the cup CP. A nozzle 141 for supplying a resist solution (or a thinner) onto the wafer W is disposed above the spin chuck 140. The spin chuck 140 is ascendable and descendable. The nozzle 141 is provided on the tip of a support member of which the illustration is omitted and is moved to a withdrawal position 66 outside the cup CP by the base of the support member being turned.

Figure 8:
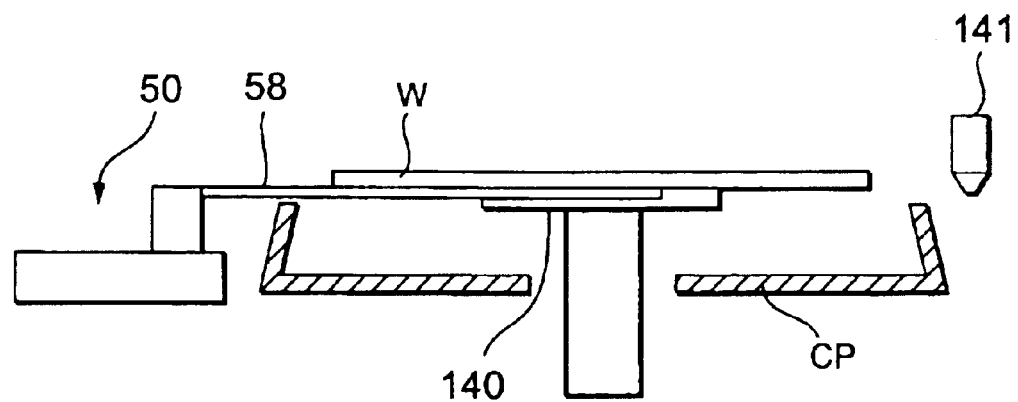
FIG. 8 is an explanatory view of operations of the resist coating unit shown in FIG. 7.

Then, in a state where the nozzle 141 is moved to the withdrawal position and the spin chuck 140 ascends as shown in FIG. 8, the wafer W is delivered from the tweezers 58 of the first transfer apparatus 50 onto the spin chuck 140.

Figure 9:
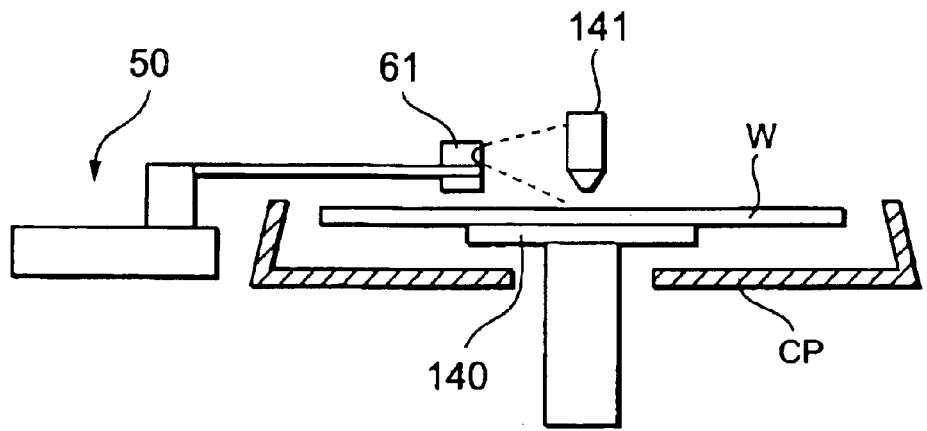
FIG. 9 is an explanatory view of operations of the resist coating unit shown in FIG. 7.
Figure 10:
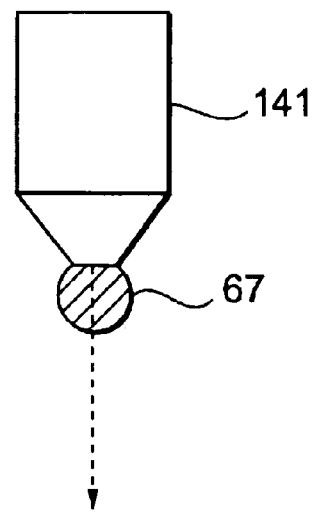
FIG. 10 is an explanatory view of an example of monitoring in the resist coating unit shown in FIG. 7.
Figure 11:
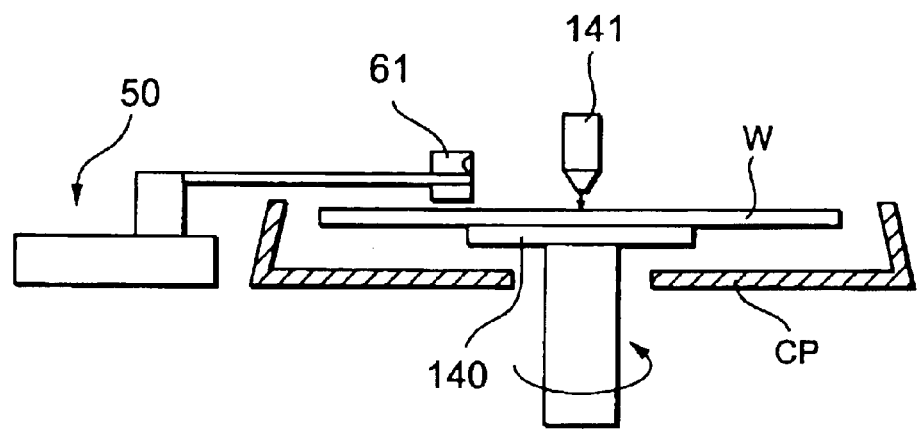
FIG. 11 is an explanatory view of another example of monitoring in the resist coating unit shown in FIG. 7.

Next, the tweezers 58 of the first transfer apparatus 50 withdraws as shown in FIG. 9, the spin chuck 140 descends, and the CCD camera 61 of the first transfer apparatus 50 approaches to the nozzle 141 together with the nozzle 141 moving to the center above the wafer W to pick-up an image of the tip of the nozzle 141. The control portion 63 checks whether or not a liquid drip 67 of the resist solution appears at the tip of the nozzle 141 as shown in FIG. 10 based on the image pickup result. For instance, when detecting a display shown in FIG. 10, the control portion 63 displays that fact on the display portion 64 or stops the operation of the processing unit. Subsequently, the spin chuck 140 rotates and supply of the resist solution from the tip of the nozzle 141 onto the surface of the wafer W is started as shown in FIG. 11.

Figure 12:
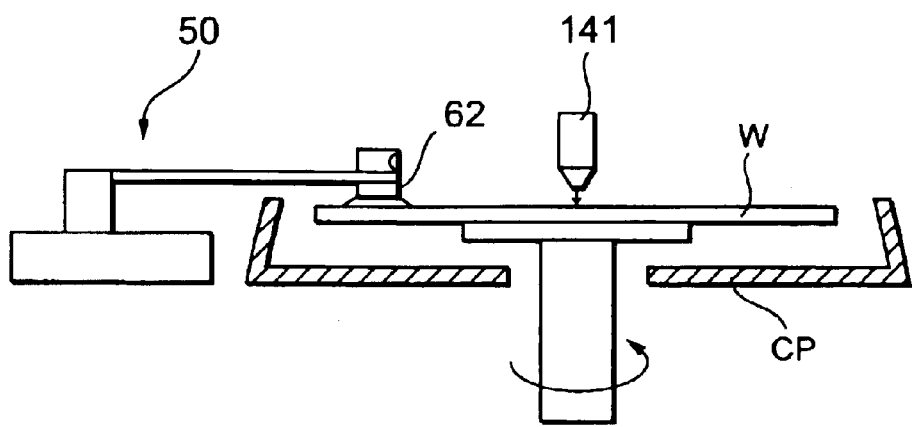
FIG. 12 is an explanatory view of operations of the resist coating unit shown in FIG. 7.
Figure 13:
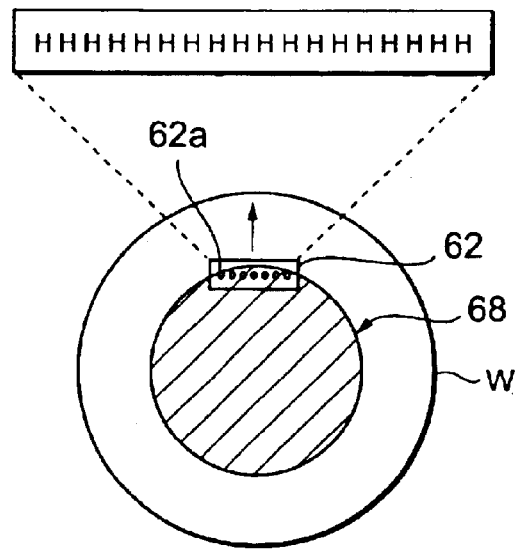
FIG. 13 is en explanatory view of still another example of monitoring in the resist coating unit.
Figure 14:
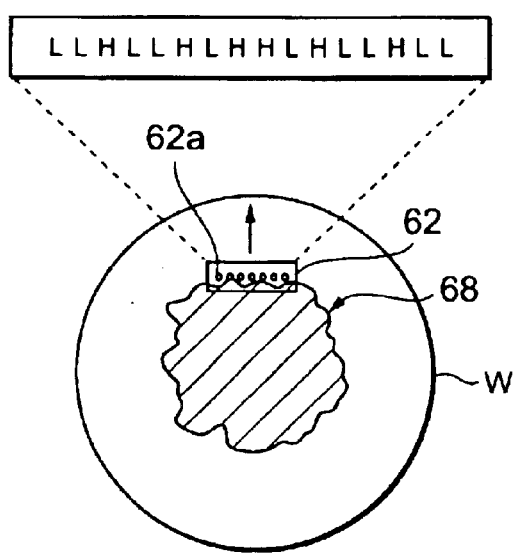
FIG. 14 is an explanatory view of yet another example of monitoring in the resist coating unit.

Next, the laser displacement measurement apparatus 62 moves toward the outer periphery of the wafer W together with the CCD camera 61 as shown in FIG. 12. The moving speed is made synchronized nearly with the speed at which the resist solution extends by centrifugal force on the wafer W. Thereby, the laser displacement measurement apparatus 62 picks-up an image of the condition of the edge of the extending resist solution spreading out. For instance, as shown in FIG. 13 and FIG. 14, the laser displacement measurement apparatus 62 has many sensing elements 62a along the Y-direction. As shown in FIG. 13, when an edge 68 of the resist solution extending on the wafer W takes the form of almost an outer periphery of a circle, all the sensing elements 62a in the laser displacement measurement apparatus 62 output 'High', for example. As shown in FIG. 14, conversely when jags appear at the edge 68 of the resist solution extending on the wafer W, some sensing elements 62a in the laser displacement measurement apparatus 62 output 'Low', for example. When jags appear at the edge 68 of the extending resist solution on the wafer W as shown in FIG. 14, the control portion 63 controls the number of revolutions of the spin chuck 140, or controls the amount of discharge, and the discharge pressure, the time to reach, the film thickness, and the like of the resist solution based on the image pickup results. Thereby, resist solution saving and uniform coating can be realized. It is also preferable that instead of being moved synchronously, the laser displacement measurement apparatus is previously disposed at a predetermined position and monitors the time to reach, the film thickness, and the like of the solution.

After the completion of the supply of the resist solution, the rotation of the spin chuck 140 stops, the nozzle 141 moves to the withdrawal position, the spin chuck 140 ascends, and the wafer W is delivered from the spin chuck140 to the tweezers 58 of the first transfer apparatus 50.

Since the developing processing units 31 to 34 have nearly the same structure as shown in FIG. 7, the description thereof is omitted, but it is possible to perform monitoring with the CCD camera 61 also in the developing processing units 31 to 34. For instance, a color tone or color shading changes with progress of developing in the surface of the wafer W in a developing processing step. Therefore, for instance, the color tone or the color shading in the surface of the wafer W when optimally developed is previously stored and an image of the surface of the wafer W is picked-up by the CCD camera 61 on developing. If developing processing is stopped when the image pickup result matches with the previously stored color tone or color shading in the surface of the wafer W, optimal developing can be performed. Alternatively, it is also possible that if some kind of abnormal condition is found in the color tone or the color shading in the surface of the wafer W, that fact is reported.

The above is preferably performed, for example, in the automatic mode as required.

Next, operations in the manual mode to check whether or not the resist solution is supplied onto the center of the wafer W in the resist coating units 21 to 24 will be explained.

Figure 15C:
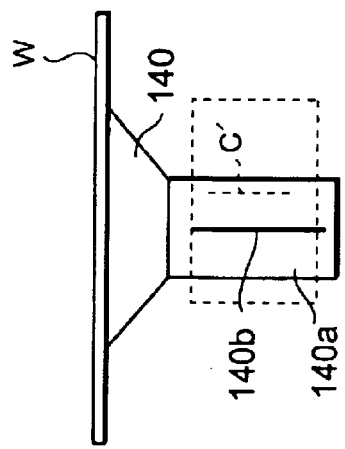
FIG. 15A to FIG. 15D are explanatory views of an example of monitoring in the resist coating unit.
Figure 15A:
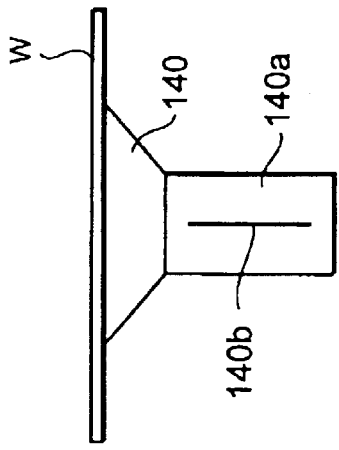
Figure 15D:
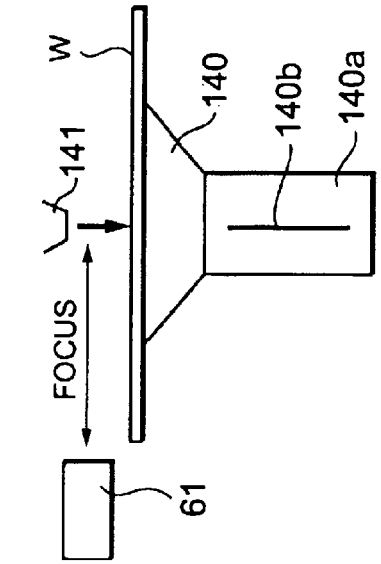
Figure 15B:
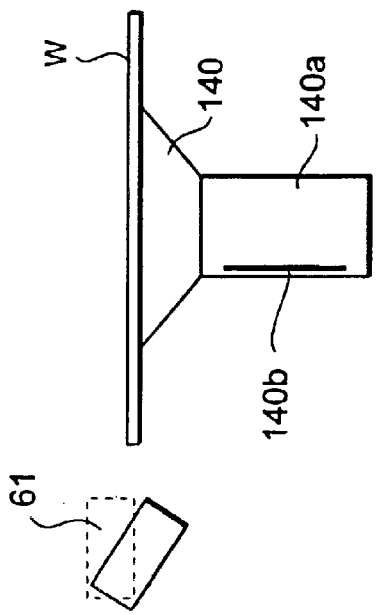

As shown in FIG. 15A, a center line 140b is drawn on the surface of the rotation shaft 140a of the spin chuck 140 in each of the resist coating units 21 to 24. For instance, when the spin chuck 140 is set in the manual mode, the spin chuck 140 stops at a position where the center line 140b thereof is in front of the CCD camera 61. In this state, as shown in FIG. 15B, the CCD camera 61 tilts downward to pick-up an image of the rotation shaft 140a of the spin chuck 140. Then, if the resist solution is not supplied onto the center C' of the wafer W as shown in FIG. 15C, the control portion 63 displays that fact on the display portion 64 or moves the nozzle 141 based on the image pickup result so that the resist solution is supplied onto the center of the wafer W. Next, as shown in FIG. 15D, the CCD camera 61 is changed into a state of facing in the horizontal direction, and supply of the resist solution is started from the tip of the nozzle 141 onto the surface of the wafer W (for instance, a dummy wafer). The CCD camera 61 picks-up an image of a state in which the resist solution is supplied onto the surface of the wafer W, and the control portion 63 decides whether or not there is a deviation in focussing based on the image pickup result. For instance, if the control portion 63 decides existence of a deviation in focussing, it displays that fact on the display portion 64 or moves the nozzle 141 so as to eliminate the deviation in focussing. Through the above operations, it is possible to check whether or not the resist solution is supplied onto the center of the wafer W in each of the resist coating units 21 to 24 and to perform correction thereof.

Figure 16:
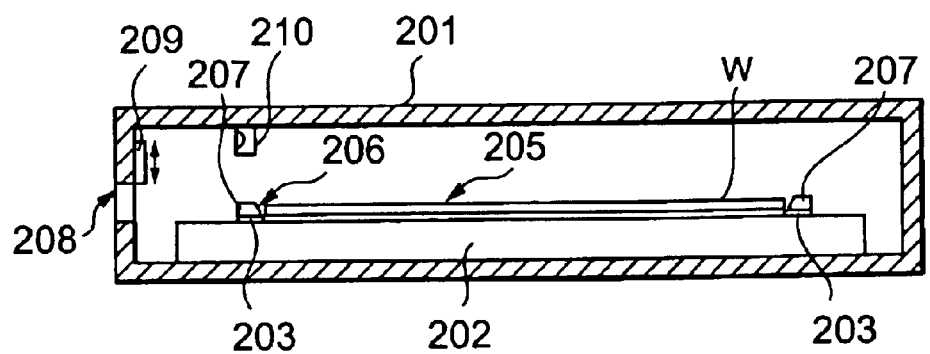
FIG. 16 is a view showing a schematic structure of a prebaking unit and a postbaking unit in the coating and developing processing system shown in FIG. 1.

FIG. 16 is a schematic view of prebaking units 94, 95, 101, and 102 and postbaking units 96, 97, 98, 105, 106, and 107.

As shown in FIG. 16, a hot plate 202 for performing heating processing for the wafer W is disposed nearly at the center of a casing 201. On the hot plate 202, proximity pins 203 for holding the wafer W isolated from and above the hot plate 202 are disposed and further a plurality of guides 207 each having an inclined face 206 oriented toward a wafer mounting position 205 which is nearly at the center on the hot plate 202 are provided in such a manner to surround the wafer mounting position 205.

Moreover, the casing 201 is provided with an opening 208 for delivering the wafer W to/from the transfer apparatus 50 or 60. The opening 208 can be freely opened and closed by means of a window member 209, and the opening 208 is opened when the wafer W is delivered to/from the transfer apparatus 50 or 60 and the opening 208 is closed by means of the window member 209 when heating processing is performed for the wafer W in the unit.

Furthermore, in this unit, a hoisting and lowering pin (not shown) for delivering the wafer W to/from the transfer apparatus 50 or 60 is disposed to be able to appear and disappear from the surface of the hot plate 202. The hoisting and lowering pin in a state of appearing from the surface of the hot plate 202 receives the wafer W from the transfer apparatus and then lowers to disappear from the surface of the hot plate 202. Thereby, the wafer W is placed on the surface of the hot plate 202.

In this unit, a CCD camera 210 as another image pickup means is disposed at a predetermined position. The CCD camera 210 picks-up an image of a portion which the CCD camera 61 of the transfer apparatus 50 described later can not pick-up, for example, the inside of the window member 209. Thereby, it becomes possible to pick-up an image throughout the inside of the unit and to monitor it.

Figure 17:
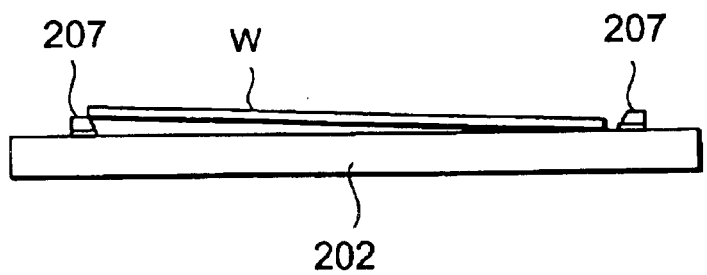
FIG. 17 is an explanatory view of an example of monitoring in the prebaking unit and the postbaking unit shown in FIG. 15.

In the unit, the CCD camera 61 of the transfer apparatus 50 picks-up an image of the wafer W placed on the hot plate 202. When the control portion 63 detects that the wafer W has run on the guide 207 due to a transfer mistake or the like as shown in FIG. 17 based on the image pickup result, the control portion 63 displays that fact on the display portion 64 or causes the hoisting and lowering pin (not shown) to hoist and lower to perform another alignment of the wafer W. Thereby, the heating processing for the wafer W can be performed accurately.

Incidentally, as for the cooling unit, the structure thereof is almost the same as that of the unit of the above heating system, and thus the same monitoring can be performed.

Next, operations of the coating and developing processing system 1 structured as above will be explained.

First, the wafer transfer body 11 gets access to a cassette C to take out one unprocessed wafer W in the cassette station 2. Then, the wafer W is transferred to the alignment unit 92 of the first heating processing unit group 90 by the wafer transfer body 11. The wafer w for which alignment is completed in the alignment unit 92 is transferred to the adhesion unit 91 included in the same first heating processing unit group 90 while held by the tweezers 58 on the lower side provided in the second transfer apparatus 60. Subsequently, after the completion of the hydrophobic processing, the wafer W is transferred to the delivery table 40 while held by the tweezers 58 of the second transfer apparatus 60.

Then, the wafer W is held by the tweezers 58 on the lower side provided in the first transfer apparatus 50 and transferred from the delivery table 40 to a first cooling processing unit group 70, and carried in, for example, a cooling unit 72 of the first cooling processing unit group 70.

The wafer W for which predetermined cooling processing is completed in the cooling unit 72 is transferred to the resist coating unit group 20 while held by the tweezers 58 of the first transfer apparatus 50.

The wafer W transferred to the resist coating unit group 20 is carried in, for example, the resist coating unit 21, where a resist film is formed. The wafer W on which the resist film is formed is thereafter transferred to the delivery table 40 while held by the tweezers 57 on the upper side in the first transfer apparatus 50.

The wafer W transferred to the delivery table 40 is held by the tweezers 58 of the second transfer apparatus 60 and transferred to a second heating processing unit group 100 this time. Then, the wafer W is carried in, for example, the prebaking unit 101 included in the second heating processing unit group 100 to be subjected to predetermined heating processing.

The wafer W after the completion of the heating processing is transferred to a second cooling processing unit group 80 while held by the tweezers 58 of the second transfer apparatus. The wafer W is carried in, for example, a cooling unit 85 of the second cooling processing unit group 80 to be subjected to cooling processing. The wafer W for which cooling processing is completed in the cooling unit 85 is then carried into an extension unit 84 and stands-by there.

Subsequently, the wafer W is carried out of the extension unit 84 by a wafer transfer body 110 and transferred to a peripheral aligner 112. The wafer W of which an excess resist film at the peripheral portion thereof is removed in the peripheral aligner 112 is transferred to the aligner 4 to be subjected to predetermined exposure processing.

The wafer W which is exposed in a pattern in the aligner 4 is transferred to the second heating processing unit group 100 by the wafer transfer body 110 and carried in, for example, the post-exposure baking unit 103. The wafer W for which heating processing after the exposure processing is completed is held by the tweezers 58 of the second transfer apparatus 60 and carried in, for example, a cooling unit 81 of the second cooling processing unit group 80.

The wafer w for which predetermined cooling processing is completed in the cooling unit 81 is held by the tweezers 58 of the first transfer apparatus 50 and transferred to the delivery table 40. Thereafter, the wafer W is transferred from the delivery table 40 to the developing processing unit group 30 while held by the tweezers 58 and carried in, for example, the developing processing unit 31 to be subjected to predetermined developing processing.

The wafer W for which the developing processing is completed is transferred to the second heating processing unit group 100 while held by the tweezers 57 of the second transfer apparatus 60. Then, the wafer W is carried in, for example, the postbaking unit 105 included in the second heating processing unit group 100 to be subjected to heating processing after developing processing.

The wafer W for which the heating processing in the postbaking unit 105 is completed is transferred of the delivery table 40 while held by the tweezers 57 of the second transfer apparatus 60.

The wafer W transferred to the delivery table 40 is thereafter held by the tweezers 58 of the first transfer apparatus 50 and transferred to the first cooling processing unit group 70, and carried in, for example, the cooling unit 71 included in the first cooling processing unit group 70. The wafer W which is vigorously cooled to a predetermined temperature in the cooling unit 71 is thereafter carried in the extension unit 74 and stands-by there. The wafer w is then carried out of the extension unit 74 by the wafer transfer body 11 and housed in the cassette C on the cassette mounting table 10. Thus, a series of coating and developing processing for the wafer W is completed.

In this embodiment, the CCD camera 61 and the laser displacement measurement apparatus 62 on the transfer apparatus 50 perform the aforementioned monitoring in each unit in the above series of operations. Accordingly, it becomes unnecessary to provide such an image pickup means in each unit, whereby it becomes possible to reduce the number of components and to miniaturize and thin the processing units.

Incidentally, the present invention is not limited to the aforesaid embodiment.

For instance, another image pickup means may be mounted on the transfer apparatus 50 in addition to the CCD camera 61 and the laser displacement measurement apparatus 62, and further there is no harm in mounting a lighting means such as a lamp or the like.

Moreover, an exclusive image pickup means may be disposed also in the resist coating unit and the developing processing unit. Thereby, it becomes possible to pick-up an image throughout the liquid processing system units and to perform monitoring of them.

Furthermore, though the example in which a wafer is used for a substrate has been explained, the present invention is not limited to the above example, but it can also be applied to a case where an LCD substrate is used, for example.

Figure 18:
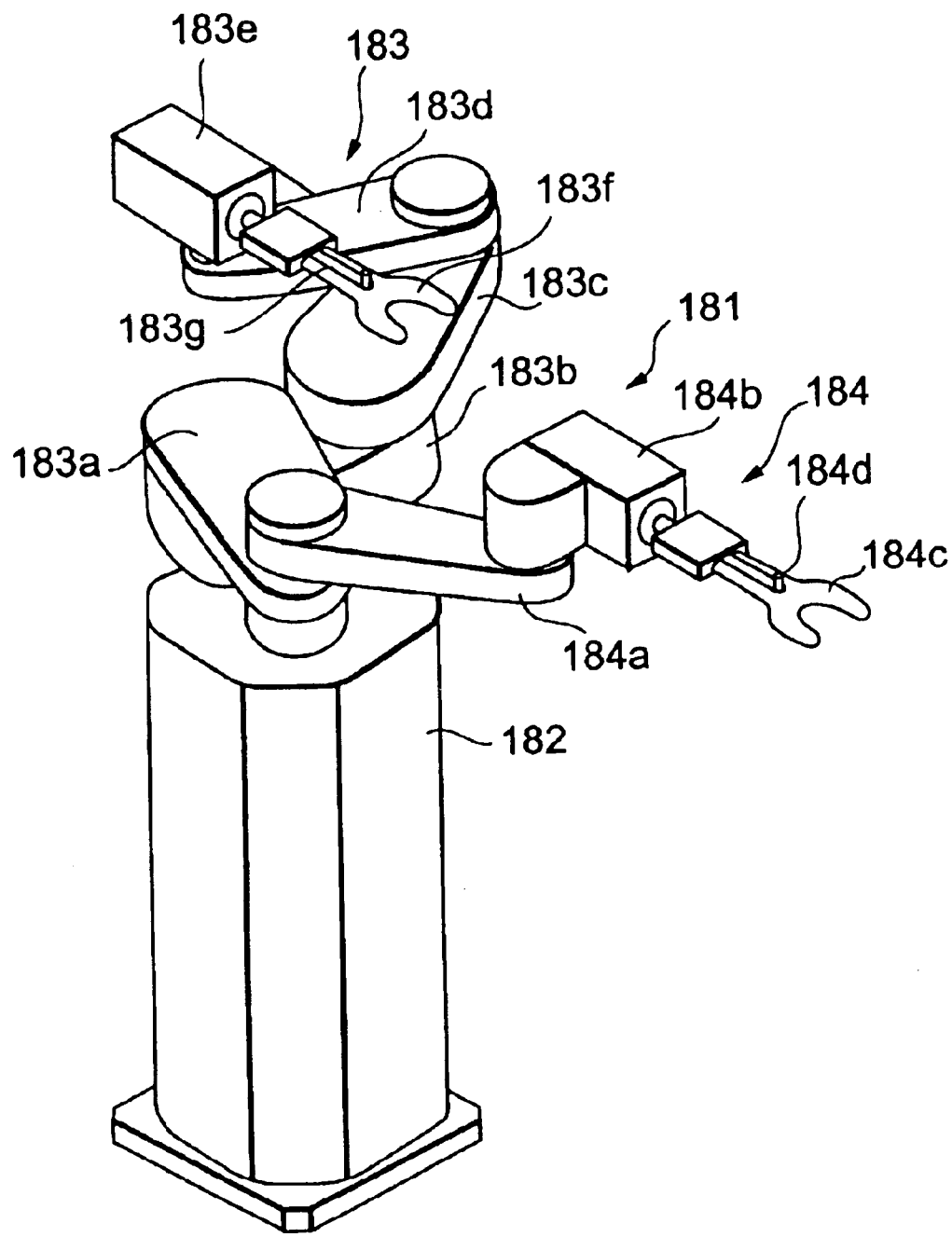
FIG. 18 is a, view showing another example of a transfer means.

In the aforesaid embodiment, the transfer apparatuses 50 and 60 of a vertical transfer-type are used, but an arm robot 181 may be used as shown in FIG. 18. In the arm robot 181 shown in FIG. 18, a main body 182 is provided with arms 183 and 184 which are vertically two-tiered. In the lower arm 184, a first arm 184*a* rotatable in the θ-direction is attached, at the tip of which a second arm 184*b* rotatable in the θ-direction is attached, at the tip of which a tweezers 184*c* is attached to be movable forward and rearward. On the top of the tweezers 184*c,* an image pickup portion 184*d* having a CCD camera and a laser displacement measurement apparatus according to the present invention is disposed.

In the upper arm 183, a first arm 183*a* rotatable in the θ-direction is attached, at the tip of which a second arm 183*b* rotatable in the θ-direction is attached, at the tip of which a third arm 183*c* rotatable in the θ-direction is attached, at the tip of which a fourth arm 183*d* rotatable in the θ-direction is attached, at the tip of which a fifth arm 183*e* rotatable in the θ-direction is attached, at the tip of which a tweezers 183*f* is attached to be movable forward and rearward. On the top of the tweezers 183*f,* an image pickup portion 183*g* having a CCD camera and a laser displacement measurement apparatus according to the present invention is disposed. According to the above structure, it is possible to make the transfer system compact.

As has been described, according to the present invention, the image pickup means for picking-up an image of the inside of the processing unit is provided on the transfer apparatus for getting access to each processing unit, so that it becomes unnecessary to provide an image pickup means for monitoring at each required place in each processing unit. Accordingly, monitoring of the required place in the processing unit can be performed without an increase in number of components and further without consideration of a space for provision of an image pickup means.

According to an embodiment of the present invention, the aforesaid processing unit is provided with another image pickup means for picking-up an image of a position which the aforesaid image pickup means can not pick-up. According to the above configuration, it is possible to pick-up an image of a place which the image pickup means provided on the transfer apparatus can not pick-up, for example, the inside of a shutter for closing the opening of the processing unit for delivering the substrate to/from the transfer apparatus and to monitor it, so that necessary and sufficient monitoring can be performed.

According to the present invention, the aforesaid image pickup means comprises at least a CCD camera and a turn drive mechanism for turning the CCD camera on a horizontal surface, so that it is possible to pick-up an image throughout a horizontal plane in the processing unit and to monitor it.

According to the present invention, the image pickup means further comprises a forward and rearward drive mechanism for driving at least the CCD camera and the turn drive mechanism forward and rearward in relation to the aforesaid processing unit, so that it is possible not only to pick-up an image of a position deep in the processing unit and to monitor it, but also to pick-up an image of the surface of the substrate while scanning the surface of the substrate and to monitor it, for instance.

According to the present invention, the transfer apparatus comprises a hold pin movable forward and rearward in relation to the processing unit while holding the substrate and an ascent and descent drive mechanism for driving the hold pin up and down, and the image pickup means is driven up and down together with the hold pin by the ascent and descent drive mechanism, so that the image pickup means can pick-up an image throughout the upper and lower portions in the processing unit and monitor them.

According to the present invention, the image pickup means comprises a plurality of kinds of image pickup apparatuses, so that it can optimally pick-up an image in accordance with pickup conditions in each unit.

According to the present invention, the system includes an automatic mode for causing the image pickup means to pick-up an image of a predetermined position in the processing unit in predetermined procedures and a manual mode for causing the image pickup means to pick-up an image of a desired position in the processing unit through manual running operations, so that it is possible to pick-up an image of also a position which is usually not picked-up by switching from the automatic mode to the manual mode when an accident occurs, for instance. Accordingly, more detailed monitoring can be performed.

According to the present invention, in the processing units, there are liquid system processing units each for performing liquid processing for a substrate and thermal system processing units each for thermal processing for the substrate, and the image pickup means is used for monitoring the processing processes for the liquid system processing units and for monitoring a physical position of the substrate for the thermal system processing units, so that the entire processing system can be monitored.

According to the present invention, monitoring the processing processes for the liquid system processing unit includes at least monitoring liquid processing based on the image pickup result of the surface of the substrate by means of the image pickup means, or monitoring the liquid processing is performed based on the color tone or the color shading in the surface of the liquid processed substrate, so that it becomes possible to perform control of, for example, the developing time based on the monitored result. For instance, a pattern of the color tone in the surface of the substrate when developing processing has been accurately performed is previously prepared, and pattern matching between the above pattern and the image pickup result is being performed in real time during developing and the developing is stopped when they are matched with each other, whereby it becomes possible to perform active control of the developing time.

The aforesaid embodiment has the intention of clarifying technical meaning of the present invention. Therefore, the present invention is not intended to be limited to the above concrete embodiment and to be interpreted in a narrow sense, and various changes may be made therein without departing from the spirit of the present invention and within the meaning of the claims.

What is claimed is:

1. A substrate processing system comprising:

a plurality of processing units each adapted to process a substrate;

a transfer apparatus adapted to convey the substrate between the processing units and including a substrate carrying arm adapted to hold the substrate when the transfer apparatus conveys the substrate; and image pickup means adapted to pick up an image of a member of the processing units or the substrate being placed in the processing units, the image pickup means being mounted to the transfer apparatus such that the image pickup means moves together with the substrate carrying arm at least when the substrate carrying arm is moving in a specific direction;

wherein:

the plurality of processing units include a resist coating unit having a spin chuck adapted to rotate while holding the substrate, and a nozzle adapted to supply a resist solution onto a center of a surface of the substrate held by the spin chuck;

the image pickup means comprises a laser displacement measurement apparatus having a plurality of sensing elements, which are arrayed, each of the sensing elements being adapted to generate a sensing signal which varies depending on a distance between each of the sensing elements and the surface of the substrate; and said substrate processing system further includes a controller configured to recognize, based on the sensing signals generated by the sensing elements, a shape of a peripheral edge of the resist solution spreading outward due to centrifugal force when the substrate supplied with the resist solution is rotated by the spin chuck.

2. The substrate processing system according to claim 1, wherein the controller is configured to judge whether or not resist solution coating conditions are appropriate based on the shape of the peripheral edge of the resist solution, and configured to control the resist coating unit to change a supplying rate of the resist solution supplied from the nozzle or a rotating speed of the spin chuck, if it is judged that the resist solution coating conditions are not appropriate.

3. A substrate processing system comprising:

a plurality of processing units each adapted to process a substrate;

a transfer apparatus adapted to convey the substrate between the processing units and including a substrate carrying arm adapted to hold the substrate when the transfer apparatus conveys the substrate; and image pickup means adapted to pick up an image of a member of the processing units or the substrate being placed in the processing units, the image pickup means being mounted to the transfer apparatus such that the image pickup means moves together with the substrate carrying arm at least when the substrate carrying arm is moving in a specific direction;

wherein:

the plurality of processing units include a developing unit adapted to develop an exposed resist film formed on the substrate by supplying a developing solution onto the substrate;

said substrate processing system further includes a controller having a memory in which a color tone or a color shading of an optimally-developed substrate is stored; and the controller is configured to monitor a color tone or a color shading of the resist being developed by the developing unit by using the image pickup means, and configured to control the developing unit to stop a developing operation of the developing unit when the color tone or the color shading of the resist being developed by the developing unit matches the color tone or the color shading of the optimally-developed substrate stored in the memory.

4. A substrate processing system comprising:

a plurality of processing units each adapted to process a substrate;

a transfer apparatus adapted to convey the substrate between the processing units and including a substrate carrying arm adapted to hold the substrate when the transfer apparatus conveys the substrate; and image pickup means adapted to pick up an image of a member of the processing units or the substrate being placed in the processing units, the image pickup means being mounted to the transfer apparatus such that the image pickup means moves together with the substrate carrying arm at least when the substrate carrying arm is moving in a specific direction;

wherein:

the plurality of processing units include a resist coating unit having a spin chuck adapted to rotate while holding the substrate, and a nozzle adapted to supply a resist solution onto a center of a surface of the substrate held by the spin chuck;

the spin chuck has a rotation shaft, and a line extending parallel to a rotational axis of the spin chuck is drawn on a circumferential surface of the rotation shaft; and said substrate processing system further includes a controller configured to control the spin chuck to turn the rotation shaft to an angular position where the line opposes the image pickup means, configured to judge whether or not the nozzle is located in an appropriate position with respect to a first direction where the nozzle can supply the resist solution onto the center of the substrate as viewed in a second direction perpendicular to the first direction based on an image of the nozzle and the line picked up by the image pickup means, and configured to control the resist coating unit to move the nozzle to locate the appropriate position if it is judged that the nozzle is not located in the appropriate position.

5. The substrate processing apparatus according to claim 4, wherein:

the controller has a function of determining whether or not the image pickup means is in focus on a target; and the controller is configured to judge whether or not the nozzle is located in an appropriate position with respect to the second direction where the nozzle can supply the resist solution onto the center of the substrate as viewed in the first direction based on a focusing condition of an image of the resist solution being supplied to the substrate picked up by the image pickup means, and configured to control the resist coating unit to move the nozzle to locate the appropriate position with respect to the second direction if it is judged that the nozzle is not located in the appropriate position with respect to the second direction.

6. A substrate processing system comprising:

a plurality of processing units each adapted to process a substrate;

a transfer apparatus adapted to convey the substrate between the processing units and including a substrate carrying arm adapted to hold the substrate when the transfer apparatus conveys the substrate; and image pickup means adapted to pick up an image of a member of the processing units or the substrate being placed in the processing units, the image pickup means being mounted to the transfer apparatus such that the image pickup means moves together with the substrate carrying arm at least when the substrate carrying arm is moving in a specific direction;

wherein:

the plurality of processing units include a baking unit or a cooling unit, which includes a processing plate adapted to heat or cool the substrate, a substrate lifter adapted to receive the substrate from the transfer apparatus and descend to place the substrate on the processing place, and a guide member adapted to guide the substrate to place the substrate at an appropriate position on the processing plate when the substrate is being lowered by the substrate lifter;

said substrate processing system further includes a controller configured to judge whether or not the substrate rests on the guide member based on an image of the substrate placed on the processing plate picked up by the image pickup means, and configured to control the substrate lifter to rise and descend in order to raise and lower the substrate if it is judged that the substrate rests on the guide member and thus is not placed at the appropriate position on the processing plate.

7. A substrate processing system comprising:

a plurality of processing units each adapted to process a substrate;

a transfer apparatus adapted to convey the substrate between the processing units and including a substrate carrying arm adapted to hold the substrate when the transfer apparatus conveys the substrate; and image pickup means adapted to pick up an image of a member of the processing units or the substrate being placed in the processing units, the image pickup means being mounted to the transfer apparatus such that the image pickup means moves together with the substrate carrying arm at least when the substrate carrying arm is moving in a specific direction;

wherein:

the plurality of processing units include a resist coating unit having a spin chuck adapted to rotate while holding the substrate, and a nozzle adapted to supply a resist solution onto a center of a surface of the substrate held by the spin chuck;

said substrate processing system further includes a controller configured to judge whether or not a drip of the resist solution appears at a tip of the nozzle based on an image of the nozzle picked up by the image pickup means, after the substrate is held by the spin chuck and before the nozzle starts to supply the resist solution onto the substrate, and configured to control the resist coating apparatus to halt an operation of the resist coating apparatus if it is judged that the drip appears.

* * * * *